United States Patent [19]
Hirano

[11] Patent Number: 6,033,988
[45] Date of Patent: Mar. 7, 2000

[54] FILM FORMING METHODS

[75] Inventor: Shinji Hirano, Tokyo, Japan

[73] Assignee: Kawasaki Steel Corporation, Kobe, Japan

[21] Appl. No.: 09/014,091

[22] Filed: Jan. 27, 1998

[30] Foreign Application Priority Data

Jan. 31, 1997 [JP] Japan ..................... 9-018424

[51] Int. Cl.$^7$ .............. B05C 11/02; C23F 1/00
[52] U.S. Cl. ............ 438/694; 438/748; 438/756; 216/91; 216/97; 427/240; 118/252
[58] Field of Search .............. 427/240; 118/52; 216/91, 97; 438/748, 756, 694; 430/329

[56] References Cited

U.S. PATENT DOCUMENTS 5,779,928  7/1998  Yamashita et al. .............. 216/92

FOREIGN PATENT DOCUMENTS

| 6-168872 | 6/1994 | Japan . |
| 8-17817 | 1/1996 | Japan . |
| 9-220505 | 8/1997 | Japan . |

*Primary Examiner*—Shrive Beck
*Assistant Examiner*—Jennifer Calcagni
*Attorney, Agent, or Firm*—Oliff & Berridge, PLC

[57] ABSTRACT

There is provided a spin coating process of forming a coating film through spin coating of a solution on a substrate, wherein periphery portions of the coating film are removed. The film forming method comprises the steps of: (a) initiating dropwise dispensing of a first solvent having a relatively low affinity for the coating film at a position slightly insider a periphery of the substrate covered by the coating film; (b) initiating dropwise dispensing of a second solvent having a relatively high affinity for the coating film at a position closer to the periphery of the substrate as compared to the position of the dropwise dispensing of the first solvent, where the dropwise dispensing of the second solvent is initiated simultaneous to or after the initiation of the dropwise dispensing of the first solvent; (c) stopping the dropwise dispensing of the first solvent; and (d) stopping the dropwise dispensing of the second solvent after stopping the dropwise dispensing of the first solvent.

20 Claims, 5 Drawing Sheets

FILM FORMING METHODS

BACKGROUND OF THE INVENTION

1. Field of the Invention

The present invention relates to film forming methods for forming coating films through spin coating of solution on substrates, and particularly relates to film forming methods adapted for forming photoresist films, SOG (Spin On Glass) films, etc. on semiconductor substrates (semiconductor wafers).

2. Description of the Related Art

Hitherto, there is adopted a spin coating method as a method for forming films, such as photoresist films, SOG (Spin On Glass) films, etc., on semiconductor wafers.

According to the spin coating method, a semiconductor wafer is horizontally held and spun, while droplets of solution are dropped on the semiconductor wafer before and after the start of the spin of the semiconductor wafer, whereby a film of the solution is formed on the semiconductor wafer by centrifugal force caused by the spin of the semiconductor wafer. In the formation of films by the spin coating method, films are formed also at peripheral portions of the semiconductor wafer. In the event that the semiconductor wafer, at the peripheral portions of which coating films are formed, is accommodated into, for example, a cassette, a contact of the films formed at the peripheral portions of the semiconductor wafer with the cassette causes dust from the films. Introducing of the dust into a semiconductor device causes a malfunction of the semiconductor device. Thus, after the films are formed on the semiconductor wafer, a solvent is dropped at the peripheral portions of the semiconductor wafer so as to remove the films formed at the peripheral portions of the semiconductor wafer.

FIGS. 5–7 are cross-sectional views each showing a process for forming the SOG film on the semiconductor wafer.

First, as shown in FIG. 5, a droplet of solution 53, in which a material of the SOG film is dissolved, is dropped onto a surface 51a of a semiconductor wafer 51 having a disk configuration, the wafer 51 being fixed on a spin chuck 52 for spinning the semiconductor wafer 51. And thereafter, the semiconductor wafer 51 is spun, for example, at 3000 rpm. When the semiconductor wafer 51 is spun, centrifugal force of the spin causes a coating film 54 by solution 53 to form over a surface 51a to edges 51b of the semiconductor wafer 51 as shown in FIG. 6.

Next, as shown in FIG. 7, a solvent 56 is dropped at a position near inside the periphery of the semiconductor wafer 51, while the semiconductor wafer 51 is kept on spinning.

FIGS. 8 and 9 are illustrations each showing the state in which films formed on the peripheral portions of the semiconductor wafer 51 have been removed by means of dropping solvents as shown in FIG. 7.

In FIG. 7, in the event that the solvent 56 dropped at a position near inside the periphery of the semiconductor wafer 51 has a strong affinity for the coating film 54 covering the surface 51a of the semiconductor wafer 51, or typically the coating film 54 is soluble in the solvent 56, the films formed on the peripheral portions of the semiconductor wafer 51, of the coating film 54 may be removed. However, as shown in FIG. 8, this scheme brings about protuberances of edge portions of a film 57 retained on the surface 51a of the semiconductor wafer 51. Performing a heat treatment for the semiconductor wafer in the state of such protuberances of the edge portions of the film involves such a problem that cracking occurs in the protuberance portions and as a result dust is generated. Further, dusting occurs also in the event such that the semiconductor wafer is mechanically cramped.

For the purpose of preventing occurrence of the protuberances of films, Japanese Patent Application Laid Open Gazette Hei. 9-220505 discloses a method in which in FIG. 7, as the solvent 56 to be dropped, solvents having a weak affinity for the coating film 54 covering the surface 51a of the semiconductor wafer 51, are used. However, in the event that solvents having a weak affinity for the coating film 54 covering the surface 51a of the semiconductor wafer 51, are dropped, as shown in FIG. 9, as to a film 58 of the solution retaining on the surface 51a of the semiconductor wafer 51, an occurrence of protuberances of the peripheral portions of the film 58 are avoided, but a film 59 will be retained at the edges 51b of the semiconductor wafer 51. Accommodating such a semiconductor wafer having the films at its edges into a cassette involves such a problem that dust is generated owing to a contact of the films remaining at the edges of the semiconductor wafer with the cassette at the time of the accommodation of the semiconductor wafer.

In effect, even if solvents having a strong affinity for the solution 53, alternatively solvents having a weak affinity for the solution 53, are dropped onto the semiconductor wafer 51, any of these schemes involves such problems that protuberances of edge portions of the film 57 retained on the surface 51a of the semiconductor wafer 51 occur, or the film 59 is retained at the edges 51b of the semiconductor wafer 51, and thus finally it is impossible to avoid the problem of a generation of dust.

Hereinafter, there will be explained a result of an experiment in which 5 types of solution, A, B, C, D and E were prepared as the solution 53 in which a material of the SOG (Spin On Glass) film is dissolved; 4 types of solvents a, b, c and d were prepared as the solvent 56 for eliminating the peripheral portions of the coating films 54 formed on the semiconductor wafer 51; the coating films 54 were formed on the semiconductor wafers 51 using 5 types of solution, A, B, C, D and E respectively; and the peripheral portions of the coating films 54 were removed using 4 types of solvents a, b, c and d.

Where the 5 types of solution, A, B, C, D and E are Type 7 produced by TOKYO OHKA KOGYOU Co., LTD., Type 2 produced by TOKYO OHKA KOGYOU Co., LTD., FOX-15 produced by Toray Dow Corning Co., LTD., Type 10 produced by TOKYO OHKA KOGYOU Co., LTD. and Type 12 produced by TOKYO OHKA KOGYOU Co., LTD., respectively. The 4 types of solvents a, b, c and d are isopropyl alcohol, cyclohexanone, γ-butyrolactone, MIBK, respectively.

Table 1 shows a result of the experiment mentioned above. FIG. 10 is an explanatory view useful for understanding an evaluation method of three evaluation items (an appearance, a protuberance and an edge bead residual) shown in Table 1.

The "Appearance" shown in Table 1 indicates whether film residuals occur on regions X (shown in FIG. 10) of the semiconductor wafer 51. In case of no film residual, the "Appearance" is denoted by "Good". In the event that film residuals exist, the "Appearance" is denoted by "Residuals Exist".

The "protuberance" indicates a difference H between the thickness of the peripheral portions Y and the thickness of the central portion Z of the film 57 remaining on the surface 51a of the semiconductor wafer 51 when the solvent 56 is dropped on the semiconductor wafer 51.

The "Edge bead residual" indicates whether edge bead residuals occur on the edges 51b of the semiconductor wafer 51. In case of no edge bead residual, the "Edge bead residual" is denoted by "Non". In the event that edge bead residuals exist, the "Edge bead residual" is denoted by the "Present".

What is meant by the "Unavailable" shown in Table 1 is that there is associated with such a problem that dangerous gas for the human body will emanate through a chemical reaction between a film of solution formed by dropping the solution onto the semiconductor wafer 51 and a solvent dropped onto the film of the solution, or a chemical reaction within a liquid tank, and thus the solvent cannot be used for removal of the coating film.

As will be understood from Table 1, even if any of the types of solvents a, b, c and d is applied to the types of solution, A, B, C, D and E, it is impossible to preferably remove the periphery of the coating film 54 formed on the semiconductor wafer 51, prevent protuberances of the film and suppress the edge bead residuals.

In order to resolve the problems of dusting due to the protuberances of the film as mentioned above, Japanese Patent Application Laid Open Gazette Hei. 6-168872 discloses a method in which prior to dropping the SOG solvent onto a semiconductor wafer, the peripheral portions of the semiconductor wafer are treated with HMDS (hexamethyldisilazane) or the like so that the water-repellency can be brought about. According to this method, after the peripheral portions of the semiconductor wafer are subjected to a water-repellent treatment, solution is dropped, and the semiconductor wafer is spun. Thus, the solution, which is spread as a film toward the peripheral portions of the semiconductor wafer by centrifugal force, is shed on the peripheral portions exhibiting the water-repellency, so that the film is formed only at the central area of the semiconductor wafer. In this case, there is a need that the water-repellency is brought about on only the peripheral portions of the semiconductor wafer. However, even if it is intended that the water-repellency is brought about with, for example, HMDS on only the peripheral portions of the semiconductor wafer, the semiconductor wafer is subjected to the HMDS atmosphere in its entirety. For this reason, a film (hereinafter, referred to as a CVD film) produced by, for example, the chemical vapor deposition, is formed on a semiconductor wafer, and after the peripheral portions of the semiconductor wafer on which the CVD film has been formed is treated so that the water-repellency is brought about, solution is dropped to form a coating film. In this case, however, an adhesion of the coating film with the CVD film is extremely degraded. Thus, if a semiconductor device is manufactured in the condition that the adhesion of the films is degraded as mentioned above, then it may happen that a malfunction of the semiconductor device is brought about.

Further, Japanese Patent Application Laid Open Gazette Hei. 8-17817 discloses a method in which after the SOG solution is dropped onto a semiconductor wafer to form a coating film, hydrofluoric acid is dropped at the periphery of the SOG coating film so as to remove the peripheral portions of the coating film. In view of the matter that going of hydrofluoric acid into another film not necessary to be removed causes deterioration of a semiconductor device, and also in view of the fact that hydrofluoric acid is poisonous, it is not preferable that hydrofluoric acid is used.

SUMMARY OF THE INVENTION

In view of the foregoing, it is therefore an object of the present invention to provide a film forming method capable of certainly and safely removing the peripheral portions of a coating film subjected to a spin coating process on a substrate.

To achieve the above-mentioned object, according to the present invention, there is provided a film forming method having a spin coating process of forming a coating film through spin coating of a solution on a substrate, said film forming method comprising steps of:

(a) initiating dropping of a first solvent having a relatively low affinity for the coating film at a position slightly inside as compared with a periphery of the substrate covered by the coating film; and (b) initiating dropping of a second solvent having a relatively high affinity for the coating film at a position closer to the periphery of the substrate as compared with the position of dropping of the first solvent, in a simultaneous timing as an initiation of dropping of the first solvent, or a timing later than the initiation of dropping of the first solvent. And it is preferable to follow step (c) and (d), which is described underneath, after said step (b).

(c) stopping dropping of the first solvent; and (d) stopping dropping of the second solvent in a timing later than stopping of the dropping of the first solvent.

According to the film forming method of the present invention, after a coating film is formed through spin coating of a solution on a substrate in order to remove the coating film, which are formed on the periphery of the substrate, and in addition, in order to retain a film involving no protuberance on the edge portions of the coating film, there are used both the first solvent having a relatively low affinity for the coating film and the second solvent having a relatively high affinity for the coating film.

A dropping position of the second solvent is a position closer to the periphery of the substrate as compared with a position of dropping of the first solvent. In other words, the position of dropping of the first solvent is closer to the center of the substrate as the dropping position of the second solvent. With respect to a timing of the dropping of the second solvent, it is a simultaneous timing as an initiation of dropping of the first solvent, or a timing later than the initiation of dropping of the first solvent. This feature makes it possible to prevent the second solvent, having a relatively high affinity for the coating film on the substrate, from flowing toward the center of the substrate. Accordingly, the use of the solvent having a relatively low affinity for the coating film on the substrate, as the first solvent, makes it possible to form on the surface of the substrate a planar film involving no protuberance on the periphery by dropping of the first solvent and the second solvent. Further, according to the film forming method of the present invention, as mentioned above, the second solvent having a relatively high affinity for the coating film is dropped at the position closer to the periphery of the substrate as compared with a position of dropping of the first solvent. This feature makes it possible to remove the coating film formed on the periphery of the substrate. That is, it is possible to form a planar film on the substrate, and also to prevent the residual of films on the edges of the substrate.

In the film forming method according to the present invention, it is preferable that said spin coating process forms an SOG film on a semiconductor substrate. In this case, it is acceptable that said first solvent is cyclohexanone, and said second solvent is isopropyl alcohol.

In the event that the film forming method according to the present invention is applied for forming the SOG film on the semiconductor substrate, it is effective that the steps (a) to (d) are executed while said semiconductor substrate is spun at a rotational speed between 2000 rpm and 3000 rpm. This feature makes it possible to effectively use the dropped first and second solvents so as to eliminate the edge beads of the SOG film formed on the semiconductor substrate.

Alternatively, in the event that the film forming method according to the present invention is applied for forming the SOG film on the semiconductor substrate, it is effective that said step (b) is to initiate dropping of the second solvent in a timing later than the initiation of dropping of the first solvent, and after the initiation of dropping of the first solvent in said step (a), the rotational speed of said semiconductor substrate is altered, and then said step (b) is executed.

In the event that a solution having a low viscosity is dropped onto the semiconductor substrate to form a coating film, or in the event that a vaporization rate of an organic solvent contained in the dropped solution is high, after the initiation of dropping of the first solvent, prior to dropping of the second solvent, a rotational speed of the semiconductor substrate is increased. On the other hand, in the event that a solution having a high viscosity is dropped onto the semiconductor substrate to form a coating film, or in the event that a vaporization rate is low, oppositely, a rotational speed of the semiconductor substrate is decreased. This feature makes it possible to effectively remove the edge beads of the SOG film.

In the film forming method according to the present invention, it is preferable that said spin coating process forms a photoresist film on a semiconductor substrate. In this case, it is acceptable that said first solvent is cyclohexanone, and said second solvent is methyl-3-methoxypropionate.

In the event that the film forming method according to the present invention is applied for forming the photoresist film on the semiconductor substrate, it is preferable that the steps (a) to (d) are executed while said semiconductor substrate is spun at a rotational speed between 2000 rpm and 3000 rpm. It is also preferable that the step (b) is to initiate dropping of the second solvent in a timing later than the initiation of dropping of the first solvent, and after the initiation of dropping of the first solvent in said step (a), the rotational speed of said semiconductor substrate is altered, and then said step (b) is executed. The reason why this is to do so is the same as the SOG film.

In the film forming method according to the present invention, as such a typical concept that a solvent has a relatively low affinity for the coating film, or a solvent has a relatively high affinity for the coating film, there is adopted such a concept that the coating film is hard to dissolve (including insoluble) or easy to dissolve (or soluble).

When such a concept that the coating film is hard to dissolve or easy to dissolve is adopted, there is provided a film forming method having a spin coating process of forming a coating film through spin coating of a solution on a substrate, said film forming method comprising steps of:

(a) initiating dropping of a first solvent, into which the coating film is hard to dissolve, at a position slightly inside as compared with a periphery of the substrate covered by the coating film; and (b) initiating dropping of a second solvent, into which the coating film is easy to dissolve, at a position closer to the periphery of the substrate as compared with the position of dropping of the first solvent, in a simultaneous timing as an initiation of dropping of the first solvent, or a timing later than the initiation of dropping of the first solvent. And it is preferable to follow step (c) and (d), which is described underneath, after said step (b).

(c) stopping dropping of the first solvent; and (d) stopping dropping of the second solvent in a timing later than stopping of the dropping of the first solvent.

Also in the above-mentioned film forming method according to the present invention, it is preferable that said spin coating process forms an SOG film on a semiconductor substrate. In this case, it is acceptable that said first solvent is cyclohexanone, and said second solvent is isopropyl alcohol.

It is preferable that the steps (a) to (d) are executed while said semiconductor substrate is spun at a rotational speed between 2000 rpm and 3000 rpm. It is also preferable that said step (b) is to initiate dropping of the second solvent in a timing later than the initiation of dropping of the first solvent, and after the initiation of dropping of the first solvent in said step (a), the rotational speed of said semiconductor substrate is altered, and then said step (b) is executed.

In the film forming method according to the present invention, it is possible to adopt such a concept that a solute in the coating film is hard to dissolve (including insoluble) or easy to dissolve (or soluble) in a solvent. When this concept is adopted, there is provided a film forming method having a spin coating process of forming a coating film through spin coating of a solution on a substrate, said film forming method comprising steps of:

(a) initiating dropping of a first solvent, into which solutes contained in the coating film is hard to dissolve, at a position slightly inside as compared with a periphery of the substrate covered by the coating film; and (b) initiating dropping of a second solvent, into which solutes contained in the coating film is easy to dissolve, at a position closer to the periphery of the substrate as compared with the position of dropping of the first solvent, in a simultaneous timing as an initiation of dropping of the first solvent, or a timing later than the initiation of dropping of the first solvent.

And it is preferable to follow step (c) and (d), which is described underneath, after said step (b).

(c) stopping dropping of the first solvent; and (d) stopping dropping of the second solvent in a timing later than stopping of the dropping of the first solvent.

Also in the above-mentioned film forming method according to the present invention, it is preferable that said spin coating process forms an SOG film on a semiconductor substrate. In this case, it is acceptable that said first solvent is cyclohexanone, and said second solvent is isopropyl alcohol.

DESCRIPTION OF THE PREFERRED EMBODIMENTS

Hereinafter, there will be described embodiments of the present invention.

A film forming method according to an embodiment of the present invention will be explained, first, referring to FIGS. 5 and 6, and then referring to FIGS. 1 to 4.

Figure 5:
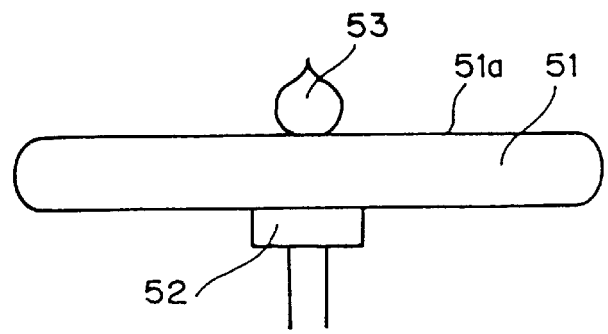
FIG. 5 is a sectional view showing the state in which solution is dropped onto a semiconductor wafer.
Figure 6:
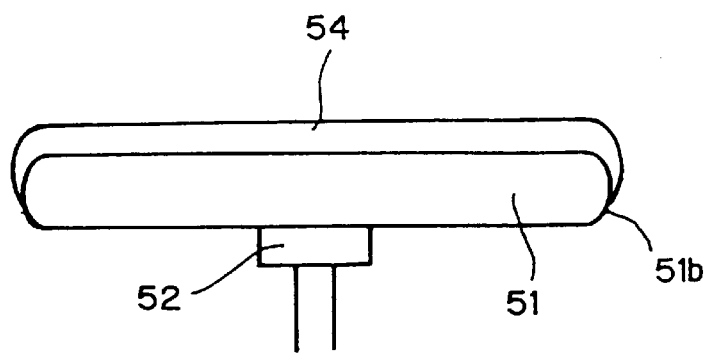
FIG. 6 is a sectional view showing the state in which a coating film is formed on the semiconductor wafer.
Figure 7:
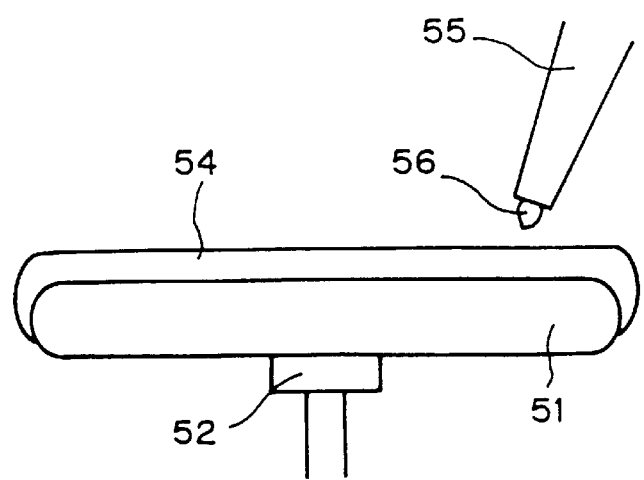
FIG. 7 is a sectional view showing the state in which solvents are dropped onto the film formed on the semiconductor wafer.
Figure 8:
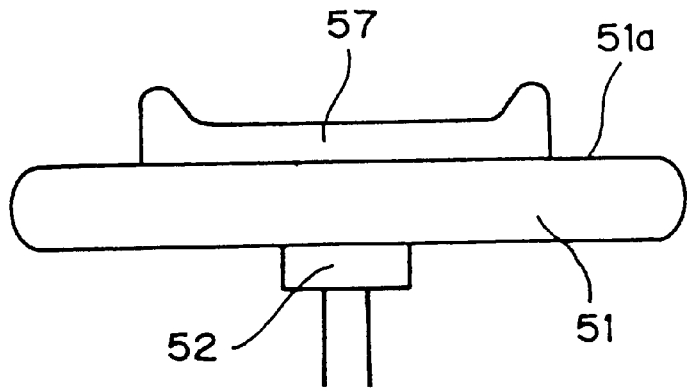
FIG. 8 is a sectional view showing the state in which a film is formed on the semiconductor wafer after solvents are dropped.
Figure 9:
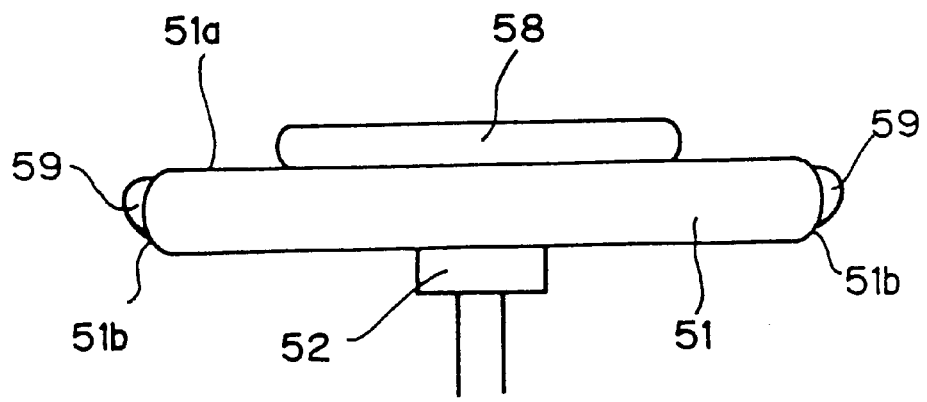
FIG. 9 is a sectional view showing the state in which a film is formed on the semiconductor wafer after solvents, which are different from that of FIG. 8, are dropped.
Figure 10:
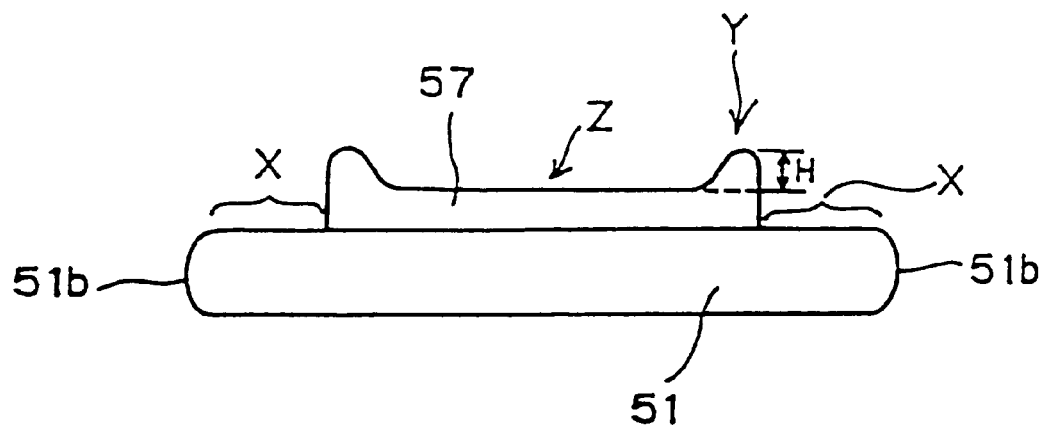
FIG. 10 is an explanatory view useful for understanding an evaluation method of three evaluation items (an appearance, a protuberance and an edge bead residual) shown in Table 1.

First, as shown in FIG. 5, a droplet of solution 53, in which a material of the SOG film is dissolved, is dropped onto the surface 51a of the semiconductor wafer 51. Thereafter, the semiconductor wafer 51 is spun to form the coating film 54 (SOG film) as shown in FIG. 6, and the following processes are practiced.

Figure 1:
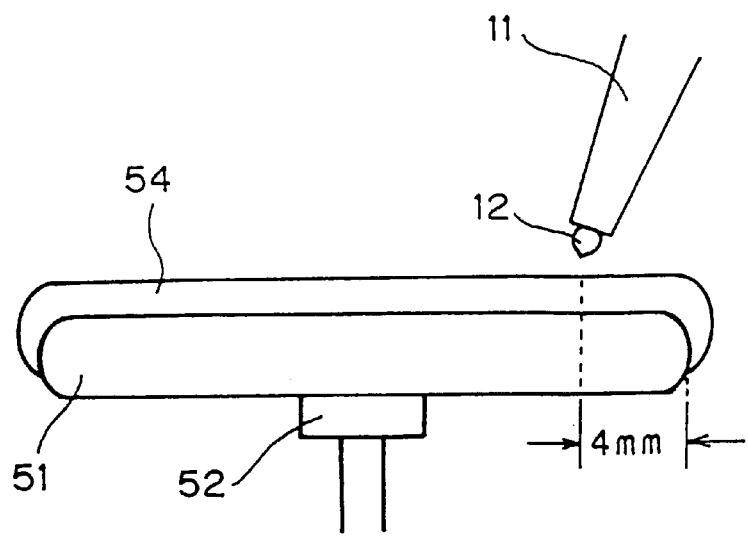
FIG. 1 is a sectional view useful for understanding a manufacturing process in a film forming method according to an embodiment of the present invention.

After the SOG film 54 is formed, as shown in FIG. 1, dropping of cyclohexanone 12, which is a solvent having a weak affinity for the SOG film, is initiated through a nozzle 11 at the position inside 4 mm from the periphery of the semiconductor wafer 51. At the instant of the initiation of the dropping, it is acceptable that the semiconductor wafer 51 is either in a stationary state or a spinning state.

Figure 2:
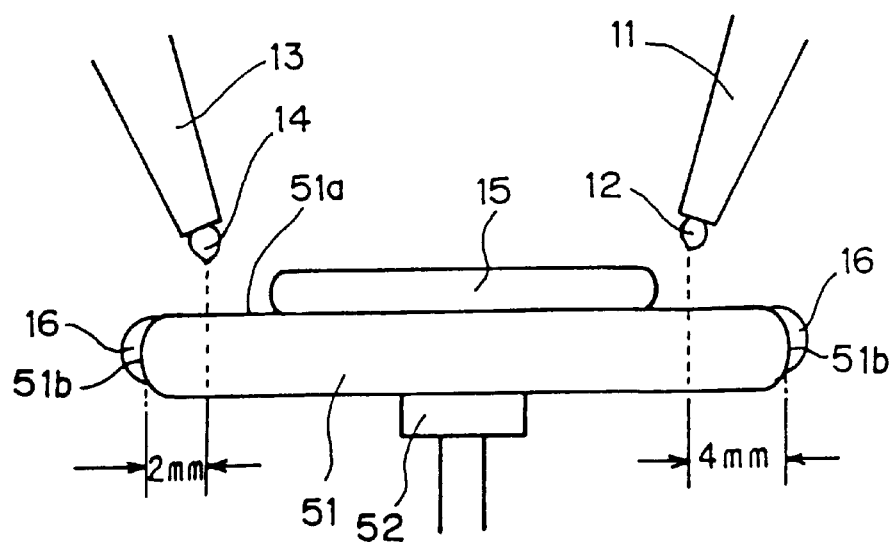
FIG. 2 is a sectional view useful for understanding a manufacturing process in a film forming method according to an embodiment of the present invention.

Next, the semiconductor wafer 51 is spun at 3000 rpm, and after 2 seconds since dropping of cyclohexanone 12 is initiated, as shown in FIG. 2, dropping of isopropyl alcohol 14, which is a solvent having a stronger affinity for the SOG film or the coating film 54 as compared with cyclohexanone 12, is initiated through a nozzle 13 at the position inside 2 mm from the periphery of the semiconductor wafer 51. Isopropyl alcohol 14 is a solvent into which the SOG film is soluble, and specifically a solvent in which silicon compounds and silicon polymers, which are solutes in the SOG film, are soluble. At the instant when isopropyl alcohol 14 is dropped, as shown in FIG. 2, a planar coating film 15 exists on the surface 51a of the semiconductor wafer 51, and a coating film 16 is spread also on the edges 51b of the semiconductor wafer 51.

Figure 3:
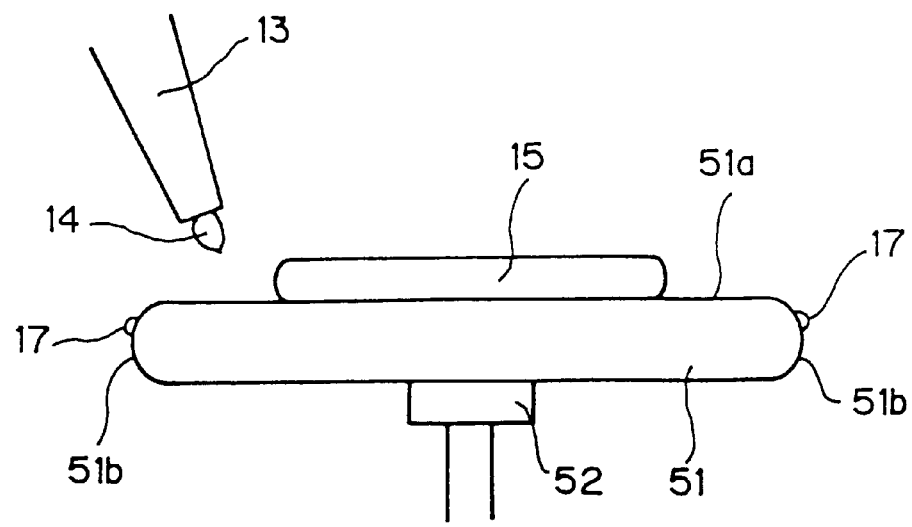
FIG. 3 is a sectional view useful for understanding a manufacturing process in a film forming method according to an embodiment of the present invention.

Next, after 5 seconds since dropping of isopropyl alcohol 14 is initiated, as shown in FIG. 3, dropping of cyclohexanone 12 is stopped, while dropping of isopropyl alcohol 14 is continued. The reason why dropping of isopropyl alcohol 14 is continued is that films 17 slightly remained on the edges 51b of the semiconductor wafer 51 may be removed.

Figure 4:
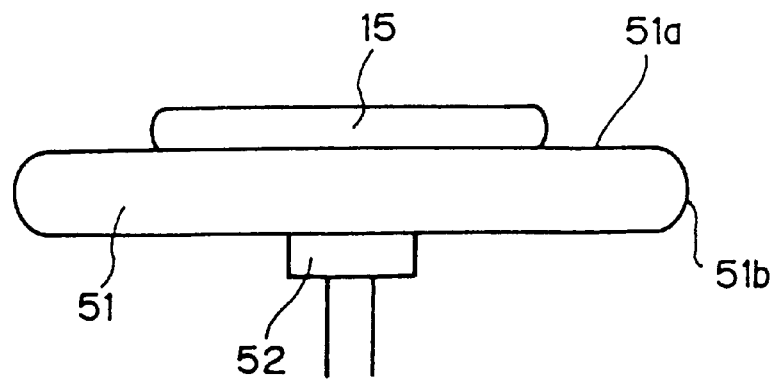
FIG. 4 is a sectional view useful for understanding a manufacturing process in a film forming method according to an embodiment of the present invention.

Next, after the films 17 are removed, as shown in FIG. 4, dropping of isopropyl alcohol 14 is stopped.

In this manner, dropping of cyclohexanone 12 onto the coating film (the SOG film) 54 formed on the semiconductor wafer 51 is initiated, and in a timing later than the initiation of dropping of cyclohexanone 12, dropping of isopropyl alcohol 14 is initiated at the position closer to the periphery of the semiconductor wafer 51 as compared with the dropping position of the cyclohexanone 12. This feature makes it possible to retain the planar coating film 15 on the surface 51a of the semiconductor wafer 51 and also to remove the films formed on the periphery of the semiconductor wafer 51, as shown in FIG. 4.

Accordingly, when the semiconductor wafer 51, on which the film 15 as shown in FIG. 4 is formed, is accommodated in a cassette, and is subjected to a heat treatment, it would hard to occur dusting, and thus it is possible to prevent a malfunction of a semiconductor device due to introducing of dust.

Incidentally, according to the present embodiment, after the solution 53 in which materials of the SOG film are dissolved is dropped onto the semiconductor wafer 51, the semiconductor wafer 51 is spun, so that the coating film 54 is formed. It is acceptable, however, that first the semiconductor wafer 51 is spun at low speed, and then the solution 53 is dropped onto the semiconductor wafer 51, so that the coating film 54 is formed on the semiconductor wafer 51.

Further, according to the present embodiment, the semiconductor wafer is spun at 3000 rpm. However, any one is acceptable, as a rotational speed of the semiconductor wafer, which generates centrifugal force in such an extent that the coating films formed on the peripheral portions of the semiconductor wafer, are removed by solvents dropped onto the semiconductor wafer.

It is also acceptable that after the initiation of dropping of cyclohexanone 12, the rotational speed of the semiconductor wafer is altered in accordance with the viscosity of the coating film and the like, and thereafter dropping of isopropyl alcohol 14 is initiated.

Furthermore, according to the present embodiment, while the dropping of isopropyl alcohol 14 is initiated in a timing later than the initiation of dropping of cyclohexanone 12, it is acceptable that cyclohexanone 12 and isopropyl alcohol 14 are simultaneously initiated in dropping of their droplets.

Still further, according to the present embodiment, of two types of solvent to be dropped onto the semiconductor wafer 51, cyclohexanone 12 is used as the solvent to be dropped at the position more apart from the periphery of the semiconductor wafer 51, or at the position closer to the center of the semiconductor wafer 51. However, any one other than cyclohexanone 12 is acceptable, as a solvent, which has a weak affinity for the coating film 54 in such an extent that no protuberance occurs on the peripheral portions of the coating film 15 to be retained on the semiconductor wafer 51. Furthermore, according to the present embodiment, isopropyl alcohol 14 is used as the solvent to be dropped at the position closer to the periphery of the semiconductor wafer 51. However, any one other than isopropyl alcohol 14, for example, γ-butyrolactone, lactic acid, etc., is acceptable, as a solvent, which has a stronger affinity for the coating film 54 on the semiconductor wafer 51 as compared with the solvent (e.g. cyclohexanone 12, in the present embodiment) to be dropped at the position closer to the center of the semiconductor wafer 51, and in addition has a strong affinity for the solution 53 in such an extent that no residual of films occurs on the edges 51b of the semiconductor wafer 51.

Next, there will be explained another embodiment of the present invention. With respect to the figures, the same figures as the first embodiment mentioned above can be used to explain the another embodiment of the present invention.

First, as shown in FIG. 5, a droplet of solution 53, in which a material of photoresist is dissolved, is dropped onto the surface 51a of the semiconductor wafer 51. Thereafter, the semiconductor wafer 51 is spun to form the coating film 54 (photoresist film) as shown in FIG. 6. The semiconductor wafer 51 is spun at 2500 rpm, and the following processes are practiced. As the photoresist material, goods on the market, which consist of "novolac resin", are used.

After the coating film 54 (photoresist film) is formed, as shown in FIG. 1, dropping of cyclohexanone 12, which is a first solvent offering no affinity for a solvent contained in the solution 53 dropped onto the surface 51a of the semiconductor wafer 51 (that is, the first solvent is remarkably different from the solution 53 in contact angle or surface tension), is initiated through a nozzle 11 at the position inside 4 mm from the periphery of the semiconductor wafer 51.

Next, after 2 seconds since dropping of cyclohexanone 12 is initiated, as shown in FIG. 2, dropping of MMP thinner (methyl-3-methoxypropionate) 14, which is a second solvent offering affinity for a solvent contained in the solution 53 dropped onto the surface 51a of the semiconductor wafer 51 (that is, the second solvent is small in contact angle or surface tension as compared with the solution 53), is initiated through a nozzle 13 at the position inside 2 mm from the periphery of the semiconductor wafer 51. At the instant when MMP thinner 14 is dropped, as shown in FIG. 2, the planar coating film 15 exists on the surface 51a of the semiconductor wafer 51, and the coating film 16 is spread also on the edges 51b of the semiconductor wafer 51.

Next, after 5 seconds since dropping of MMP thinner 14 is initiated, as shown in FIG. 3, dropping of cyclohexanone 12 is stopped, while dropping of MMP thinner 14 is continued. The reason why dropping of MMP thinner 14 is continued is that films 17 slightly remained on the edges 51b of the semiconductor wafer 51 may be removed.

Next, after the films 17 are removed, as shown in FIG. 4, dropping of MMP thinner 14 is stopped.

In this manner, dropping of cyclohexanone 12 onto the coating film (photoresist film) 54 formed on the semiconductor wafer 51 is initiated, and in a timing later than the initiation of dropping of cyclohexanone 12, dropping of MMP thinner 14 is initiated at the position closer to the periphery of the semiconductor wafer 51 as compared with the dropping position of the cyclohexanone 12. This feature makes it possible to retain the planar coating film 15 on the surface 51a of the semiconductor wafer 51 and also to remove the films formed on the periphery of the semiconductor wafer 51, as shown in FIG. 4.

In comparison of the process according to the present invention with the prior art process through a TEG (TEST ELEMENT GROUP) for a pattern short failure rate, a result as shown in Table 2 can be obtained, and the effect has been confirmed.

Accordingly, when the semiconductor wafer 51, on which the film 15 as shown in FIG. 4 is formed, is accommodated in a cassette, and is subjected to a heat treatment, it would hard to occur dusting, and thus it is possible to prevent a malfunction of a semiconductor device due to introducing of dust.

Further, according to the present embodiment, as the solvent offering no affinity for a solvent contained in the solution 53 in which the photoresist material is dissolved (that is, the solvent is remarkably different from the solution 53 in contact angle or surface tension), cyclohexanone is used. It is acceptable, however, that instead of cyclohexanone, for example, lactic acid and OK 73 thinner (mixed liquid of PGMEA and PGME) are used. Furthermore, according to the present embodiment, as the solvent offering affinity for a solvent contained in the solution 53 in which the photoresist material is dissolved (that is, the solvent is small in contact angle or surface tension as compared with the solution 53), MMP thinner is used. However, any one other than MMP thinner is acceptable, as a solvent, which offers affinity for a solvent contained in the solution 53 (that is, the solvent is small in contact angle or surface tension as compared with the solution 53).

Incidentally, according to the technology disclosed in Japanese Patent Application Laid Open Gazette Hei. 6-168872, for example, a CVD film is formed on a semiconductor wafer, and the peripheral portions of the semiconductor wafer are treated with HMDS (hexamethyldisilazane) or the like so that the water-repellency can be brought about. Thereafter, solution is dropped onto the semiconductor wafer so as to form the SOG film. This is associated with such a problem that the adhesion of the SOG film to the CVD film is degraded. On the contrary, in the film forming method according to the present invention, there is no need to bring about the water-repellency using HMDS. Thus, according to the film forming method of the present invention, even if a coating film is formed on the semiconductor wafer on which the CVD film has been formed, it is possible to avoid the degradation of the adhesion of the SOG film to the CVD film.

As mentioned above, according to the film forming method of the present invention, it is possible to form a film on a semiconductor wafer without dropping hydrofluoric acid onto the semiconductor wafer. Further, it is possible to prevent the residual of films on the peripheral portions of the semiconductor wafer, and also to form a film on the semiconductor wafer involving no protuberance on the periphery.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

TABLE 1

| | a (Isopropyl alcohol) | | | b (Cyclohexanone) | | | c (γ-butyrolactone) | | | d (MIBK) | | |
| --- | --- | --- | --- | --- | --- | --- | --- | --- | --- | --- | --- | --- |
| | Appearance | Protuberance | Edge bead residuals | Appearance | Protuberance | Edge bead residuals | Appearance | Protuberance | Edge bead residuals | Appearance | Protuberance | Edge bead residuals |
| A (Type 7) | Good | Not less than 1.0 μm | Non | Good | Non | present | Residuals Exist | Not less 0.1 μm | present | Residuals Exist | Not less than 0.5 μm | present |
| B (Type 2) | Good | Not less than 1.0 μm | Non | Good | Not less than 0.4 μm | present | Good | Non | present | Residuals Exist | Not less than 0.3 μm | present |
| C | | Unavailable | | Good | Non | present | | Unavailable | | Good | Not less | present |

TABLE 1-continued

| | a (Isopropyl alcohol) | | | b (Cyclohexanone) | | | c (γ-butyrolactone) | | | d (MIBK) | | |
|---|---|---|---|---|---|---|---|---|---|---|---|---|
| | Appearance | Protuberance | Edge bead residuals | Appearance | Protuberance | Edge bead residuals | Appearance | Protuberance | Edge bead residuals | Appearance | Protuberance | Edge bead residuals |
| (FOX) | | | | | | | | | | | than 1.0 μm | |
| D (Type 10) | Good | Not less than 1.0 μm | Non | Good | Non | present | Residuals Exist | Not less than 0.1 μm | present | Residuals Exist | Not less than 0.3 μm | present |
| E (Type 12) | Good | Not less than 1.0 μm | Non | Good | Non | present | Residuals Exist | Not less than 0.1 μm | present | Residuals Exist | Not less than 0.3 μm | present |

TABLE 2

| PROCESS | Pattern Short Failure Rate (0.5 μm Line and Space) |
|---|---|
| INVENTION | 9.9% |
| PRIOR ART | 25.0% |

I claim:

1. A spin coating process of forming a coating film through spin coating of a solution on a substrate, wherein peripheral portions of the coating film are removed by:
   (a) initiating dropwise dispensing of a first solvent having a relatively low affinity for the coating film at a position slightly inside a periphery of the substrate covered by the coating film; and
   (b) initiating dropwise dispensing of a second solvent having a relatively high affinity for the coating film at a position closer to the periphery of the substrate as compared to the position of the dropwise dispensing of the first solvent, where the dropwise dispensing of the second solvent is initiated simultaneous to or after the initiation of the dropwise dispensing of the first solvent.

2. A method according to claim 1, after said step (b), further comprising the steps of:
   (c) stopping the dropwise dispensing of the first solvent; and
   (d) stopping the dropwise dispensing of the second solvent after stopping the dropwise dispensing of the first solvent.

3. A method according to claim 2, wherein said spin coating process forms an SOG film on a semiconductor substrate.

4. A method according to claim 3, wherein said first solvent is cyclohexanone, and said second solvent is isopropyl alcohol.

5. A method according to claim 3, wherein said steps (a) to (d) are executed while said semiconductor substrate is spun at a rotational speed between 2000 rpm and 3000 rpm.

6. A method according to claim 3, wherein said step (b) is to initiate the dropwise dispensing of the second solvent after the initiation of the dropwise dispensing of the first solvent, and wherein after the initiation of the dropwise dispensing of the first solvent in said step (a), the rotational speed of said semiconductor substrate is altered, and then said step (b) is executed.

7. A method according to claim 2, wherein said spin coating process forms a photoresist film on a semiconductor substrate.

8. A method according to claim 7, wherein said first solvent is cyclohexanone, and said second solvent is methyl-3-methoxypropionate.

9. A method according to claim 7, wherein said steps (a) to (d) are executed while said semiconductor substrate is spun at a rotational speed between 2000 rpm and 3000 rpm.

10. A method according to claim 7, wherein said step (b) is to initiate the dropwise dispensing of the second solvent after the initiation of the dropwise dispensing of the first solvent, and
    wherein after the initiation of the dropwise dispensing of the first solvent in said step (a), the rotational speed of said semiconductor substrate is altered, and then said step (b) is executed.

11. A spin coating process of forming a coating film through spin coating of a solution on a substrate, wherein peripheral portions of the coating film are removed by:
    (a) initiating dropwise dispensing of a first solvent, into which the coating film is hard to dissolve, at a position slightly inside a periphery of the substrate covered by the coating film; and
    (b) initiating dropwise dispensing of a second solvent, into which the coating film is easy to dissolve, at a position closer to the periphery of the substrate as compared to the position of the dropwise dispensing of the first solvent, where the dropwise dispensing of the second solvent is initiated simultaneous to or after the initiation of the dropwise dispensing of the first solvent.

12. A method according to claim 11, after said step (b), further comprising the steps of:
    (c) stopping the dropwise dispensing of the first solvent; and
    (d) stopping the dropwise dispensing of the second solvent after stopping the dropwise dispensing of the first solvent.

13. A method according to claim 12, wherein said spin coating process forms an SOG film on a semiconductor substrate.

14. A method according to claim 13, wherein said first solvent is cyclohexanone, and said second solvent is isopropyl alcohol.

15. A method according to claim 13, wherein said steps (a) to (d) are executed while said semiconductor substrate is spun at a rotational speed between 2000 rpm and 3000 rpm.

16. A method according to claim 13, wherein said step (b) is to initiate the dropwise dispensing of the second solvent after the initiation of the dropwise dispensing of the first solvent, and
    wherein after the initiation of the dropwise dispensing of the first solvent in said step (a), the rotational speed of said semiconductor substrate is altered, and then said step (b) is executed.

17. A spin coating process of forming a coating film through spin coating of a solution on a substrate, wherein peripheral portions of the coating film are removed by:

(a) initiating dropwise dispensing of a first solvent, into which solutes contained in the coating film are hard to dissolve, at a position slightly inside a periphery of the substrate covered by the coating film; and (b) initiating dropwise dispensing of a second solvent, into which solutes contained in the coating film are easy to dissolve, at a position closer to the periphery of the substrate as compared to the position of the dropwise dispensing of the first solvent, where the dropwise dispensing of the second solvent is initiated simultaneous to or after the initiation of the dropwise dispensing the first solvent.

18. A method according to claim 17, after said step (b), further comprising the steps of:

(c) stopping the dropwise dispensing of the first solvent; and (d) stopping the dropwise dispensing of the second solvent after stopping the dropwise dispensing of the first solvent.

19. A method according to claim 18, wherein said spin coating process forms an SOG film on a semiconductor substrate.

20. A method according to claim 18, wherein said first solvent is cyclohexanone, and said second solvent is isopropyl alcohol.

* * * * *